(12) United States Patent
Hatano et al.

(10) Patent No.: US 12,211,720 B2
(45) Date of Patent: Jan. 28, 2025

(54) VACUUM TRANSFER DEVICE, SUBSTRATE PROCESSING SYSTEM, AND SUBSTRATE PROCESSING METHOD

(71) Applicant: Tokyo Electron Limited, Tokyo (JP)

(72) Inventors: Tatsuo Hatano, Yamanashi (JP); Naoki Watanabe, Yamanashi (JP); Tetsuya Miyashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 800 days.

(21) Appl. No.: 17/381,813

(22) Filed: Jul. 21, 2021

(65) Prior Publication Data

US 2022/0037181 A1    Feb. 3, 2022

(30) Foreign Application Priority Data

Jul. 30, 2020  (JP) .................................. 2020-129092

(51) Int. Cl.
| | | |
|---|---|---|
| *H01L 21/677* | (2006.01) | |
| *H01L 21/67* | (2006.01) | |
| *H01L 21/683* | (2006.01) | |

(52) U.S. Cl.
CPC .. *H01L 21/67709* (2013.01); *H01L 21/67167* (2013.01); *H01L 21/67184* (2013.01); *H01L 21/67248* (2013.01); *H01L 21/6838* (2013.01)

(58) Field of Classification Search
CPC ......... H01L 21/67167; H01L 21/67184; H01L 21/67248; H01L 21/67709; H01L 21/6838
See application file for complete search history.

(56) References Cited

U.S. PATENT DOCUMENTS

| | | | | |
|---|---|---|---|---|
| 2022/0130701 A1* | 4/2022 | Hatano | ............ | H01L 21/67742 |
| 2022/0223447 A1* | 7/2022 | Hatano | ............ | H01L 21/67196 |
| 2022/0285191 A1* | 9/2022 | Li | ............ | H01L 21/68707 |
| 2023/0307278 A1* | 9/2023 | Li | ............ | H01L 21/67709 |

FOREIGN PATENT DOCUMENTS

| | | | | |
|---|---|---|---|---|
| JP | H05161220 A | * | 6/1993 | |
| JP | H07117849 A | * | 5/1995 | |
| JP | 2014087257 A | * | 5/2014 | ......... F16C 32/0468 |
| JP | 2017-168866 A | | 9/2017 | |
| JP | 2018-504784 A | | 2/2018 | |

* cited by examiner

*Primary Examiner* — Saul Rodriguez
*Assistant Examiner* — Brendan P Tighe
(74) *Attorney, Agent, or Firm* — Venjuris, P.C.

(57) ABSTRACT

A vacuum transfer device configured to transfer a substrate in a vacuum includes: a flat motor including a body, a plurality of electromagnetic coils arrayed in the body, and a current controller that controls a current supplied to the electromagnetic coil; a transfer unit including a substrate holder configured to hold a substrate, and a base having a plurality of magnets arrayed therein and magnetically levitating from a surface of the body by a magnetic field generated by the electromagnetic coil, and move in a magnetically levitating state thereby moving the substrate holder; and a temperature controller configured to adjust temperature of at least a portion of the body. The temperature of the transfer unit is adjusted by stopping the magnetic levitation of the base by controlling the current supplied to the electromagnetic coil, and bringing the base into contact with a temperature-adjusted portion of the body.

20 Claims, 6 Drawing Sheets

VACUUM TRANSFER DEVICE, SUBSTRATE PROCESSING SYSTEM, AND SUBSTRATE PROCESSING METHOD

CROSS-REFERENCE TO RELATED APPLICATIONS

This application is based on and claims priority from Japanese Patent Application No. 2020-129092 filed on Jul. 30, 2020 with the Japan Patent Office, the disclosure of which is incorporated herein in its entirety by reference.

TECHNICAL FIELD

The present disclosure relates to a vacuum transfer device, a substrate processing system, and a substrate processing method.

BACKGROUND

In a semiconductor manufacturing process, for example, when a semiconductor wafer serving as a substrate is processed, a substrate processing system including a plurality of processing chambers, a vacuum transfer chamber connected with the processing chambers, and a substrate transfer device provided in the vacuum transfer chamber, is used.

As for the substrate transfer device that transfers the substrate in a vacuum, a transfer robot having an articulated arm structure is used (see, e.g., Japanese Patent Laid-Open Publication No. 2017-168866).

Further, Japanese Patent Laid-Open Publication No. 2018-504784 discloses a substrate transfer device using a flat motor of magnetic levitation in order to resolve the problem in the technology of using a transfer robot where it is difficult to maintain a high vacuum due to the intrusion of gas from the vacuum seal, and additionally, the throughput is decreased due to the movement limitation of the robot.

SUMMARY

According to one aspect of the present disclosure, a vacuum transfer device that transfers a substrate in a vacuum includes: a flat motor including a body, a plurality of electromagnetic coils arrayed in the body, and a current controller configured to control a current supplied to the electromagnetic coil; a transfer unit including a substrate holder configured to hold a substrate, and a base having a plurality of magnets arrayed therein and configured to magnetically levitate from a surface of the body by a magnetic field generated by supplying power to the electromagnetic coil, and move in a magnetically levitating state thereby moving the substrate holder; and a temperature adjusting mechanism configured to adjust temperature of at least a portion of the body. A temperature of the transfer unit is adjusted by controlling the current supplied to the electromagnetic coil by the current controller to stop the magnetic levitation of the base, and bringing the base into contact with a temperature-adjusted portion of the body.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings.

First Embodiment

Figure 1:
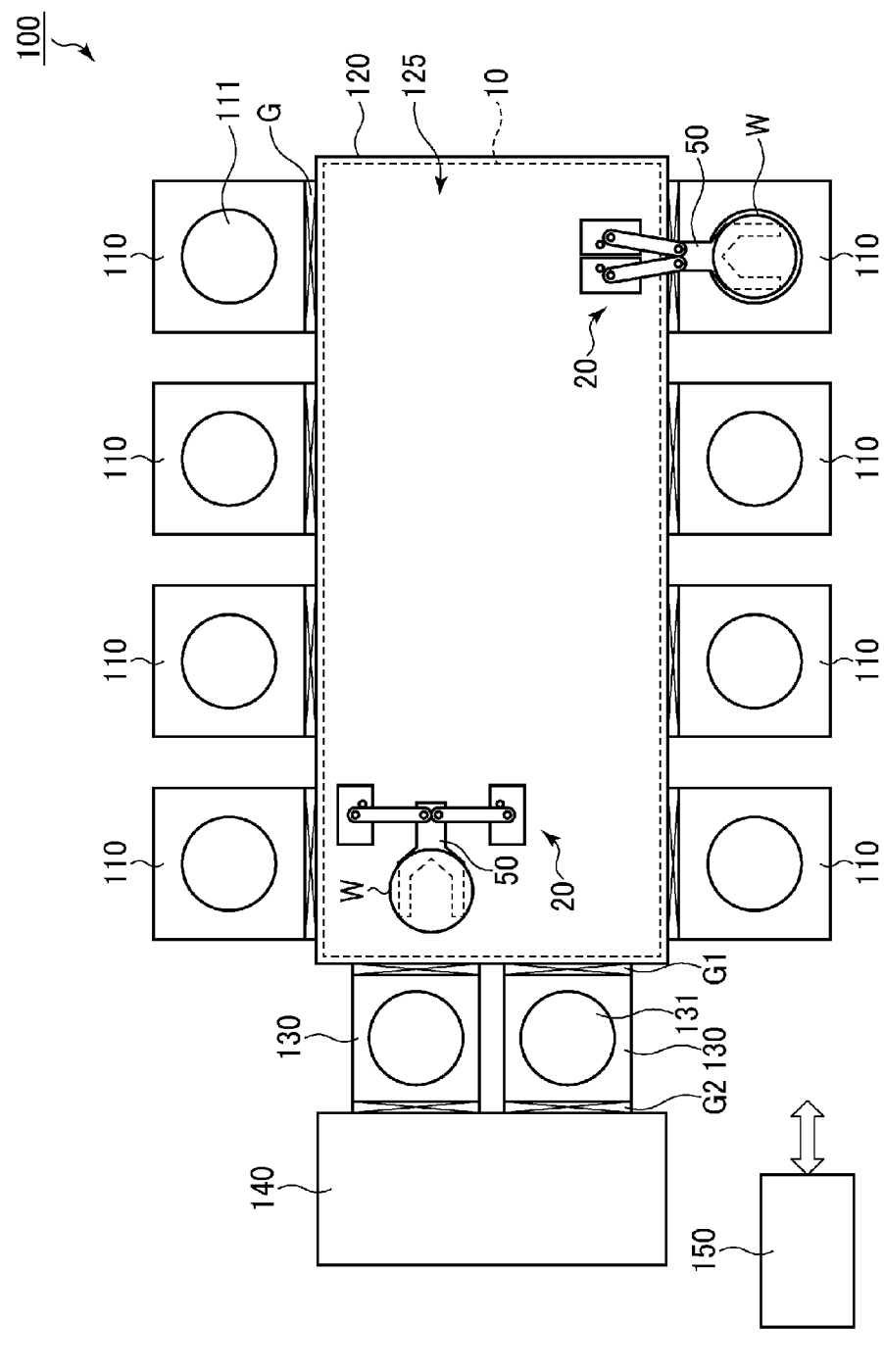
FIG. 1 is a schematic plan view illustrating a substrate processing system according to a first embodiment.

First, a first embodiment will be described.
[Substrate Processing System 100]
FIG. 1 is a schematic plan view illustrating a substrate processing system 100 according to the first embodiment.

The substrate processing system 100 of the embodiment continuously performs a required processing (e.g., a film forming processing, an etching processing, an ashing processing, and a cleaning processing) on a plurality of substrates. The substrate is not particularly limited, but a case where a semiconductor wafer (hereinafter, simply referred to as a "wafer") is used will be exemplified in the following description.

The substrate processing system 100 is a cluster structure (multi-chamber type) system, and includes a plurality of processing devices 110, a vacuum transfer chamber 120, a load lock chamber 130, an atmospheric transfer chamber 140, and a controller 150. Further, the substrate processing system 100 also includes a vacuum transfer device 125 provided in the vacuum transfer chamber 120.

The vacuum transfer chamber 120 has a rectangular planar shape, the inside thereof is depressurized to a vacuum atmosphere, and a plurality of processing chambers 110 is connected to wall portions on the long sides facing with each other via gate valves G. Further, two load lock chambers 130 are connected to one side of the short side of the vacuum transfer chamber 120 via gate valves G1. The atmospheric transfer chamber 140 is connected to the side of the two load lock chambers 130 opposite to the vacuum transfer chamber 120 via gate valves G2.

The vacuum transfer device 125 in the vacuum transfer chamber 120 performs carrying-in/out of a wafer W with respect to the processing chamber 110 and the load lock chamber 130. The vacuum transfer device 125 includes a transfer unit 20 having an end effector 50 which is a wafer holder that holds the wafer W. The details of the vacuum transfer device 125 will be described later.

The processing chamber 110 and the vacuum transfer chamber 120 communicate with each other by opening the gate valve G, so that the wafer W is able to be transferred by the vacuum transfer device 125, and the processing chamber 110 and the vacuum transfer chamber 120 are blocked from each other by closing the gate valve G. In addition, the load lock chamber 130 and the vacuum transfer chamber 120 communicate with each other by opening the gate valve G1, so that the wafer W is able to be transferred by the vacuum transfer device 125, and the load lock chamber 130 and the vacuum transfer chamber 120 are blocked from each other by closing the gate valve G1.

The processing chamber 110 includes a stage 111 on which the wafer W is placed, and performs a required processing (e.g., a film forming processing, an etching processing, an ashing processing, and a cleaning processing) on the wafer W placed on the stage 111 in a state where the inside is depressurized to a vacuum atmosphere.

The load lock chamber 130 includes a stage 131 on which the wafer W is placed, and controls the pressure between the atmospheric pressure and the vacuum when the wafer W is transferred between the atmospheric transfer chamber 140 and the vacuum transfer chamber 120.

The atmospheric transfer chamber 140 has an atmospheric atmosphere, and for example, a downflow of clean air is formed. Further, a load port (not illustrated) is provided on the wall surface of the atmospheric chamber 140. The load port is configured to be connected with a carrier (not illustrated) in which the wafer W is accommodated or an empty carrier. For example, a front opening unified pod (FOUP) may be used as the carrier.

Further, an atmospheric transfer device (not illustrated) that transfers the wafer W is provided inside the atmospheric transfer chamber 140. The atmospheric transfer device takes out the wafer W accommodated in the load port (not illustrated), and places the wafer W on the stage 131 in the load lock chamber 130, or takes out the wafer W placed on the stage 131 in the load lock chamber 130, and accommodates the wafer W in the load port. The load lock chamber 130 and the atmospheric transfer chamber 140 communicate with each other by opening the gate valve G2, so that the wafer W is able to be transferred by the atmospheric transfer device, and the load lock chamber 130 and the atmospheric transfer chamber 140 are blocked from each other by closing the gate valve.

The controller 150 is configured by a computer, and includes a main controller including a CPU, an input device, an output device, a display device, and a storage device (storage medium). The main controller controls an operation of each component of the substrate processing system 100. For example, the main controller controls the processing of the wafer W in each processing chamber 110, the transfer of the substrate by the vacuum transfer device 125 or the atmospheric transfer chamber, and the opening/closing of the gate valves G, G1, and G2. The control of each component by the main controller is executed based on a processing recipe which is a control program stored in a storage medium (e.g., a hard disk, an optical disk, or a semiconductor memory) built in the storage device.

Next, an example of the operation of the substrate processing system 100 will be described. Here, the operation of the substrate processing system 100 will be exemplified with an operation in which the wafer W accommodated in the carrier attached to the load port is processed in the processing chamber 110, and then is accommodated in an empty carrier attached to the load port. The following operation is executed based on the processing recipe of the controller 150.

First, the wafer W is taken out from the carrier connected to the load port by the atmospheric transfer device (not illustrated) in the atmospheric transfer chamber 140, and then is carried into the load lock chamber 130 having an atmospheric atmosphere by opening the gate valve G2. After the gate valve G2 is closed, the load lock chamber 130 into which the wafer W is carried becomes a vacuum state corresponding to the vacuum transfer chamber 120. Subsequently, the corresponding gate valve G1 is opened, the wafer W in the load lock chamber 130 is taken out by the end effector 50 provided in the transfer unit 20 in the vacuum transfer device 125, and the gate valve G1 is closed. Subsequently, the gate valve G corresponding to any one of the processing chambers 110, and then, the wafer W is carried into the processing chamber 110 by the end effector 50 and placed on the stage 111. Then, in the processing chamber 110, the end effector 50 is retracted, the gate valve G is closed, and then, a high-temperature processing such as a film forming processing is performed.

After the high-temperature processing in the processing chamber 110 is completed, the corresponding gate valve G is opened, and the end effector 50 of the transfer unit 20 takes out the wafer W from the processing chamber 110. After the gate valve G is closed, the gate valve G1 is opened, and the wafer W held by the end effector 50 is transferred to the load lock chamber 130. Thereafter, the gate valve G1 is closed to make the load lock chamber 130 into which the wafer W is carried into an atmospheric atmosphere. Then, the gate valve G2 is opened, and the wafer W is taken out from the load lock chamber 130 by the atmospheric transfer device (not illustrated), and is accommodated in the carrier of the load port (neither are illustrated).

The above processing is performed on a plurality of wafers W simultaneously, and the processing is performed on all the wafers W in the carrier.

The above descriptions have been made on the embodiment in which the wafer W is transferred to any one processing chamber 110 by the vacuum transfer device 125 to be processed, and the wafer W is carried out via the load lock chamber 130, but the present disclosure is not limited thereto. For example, after the wafer W is processed in one processing chamber 110, the wafer W may be transferred to another processing chamber 110 by the vacuum transfer device 125.

[Vacuum Transfer Device 125]

Figure 2:
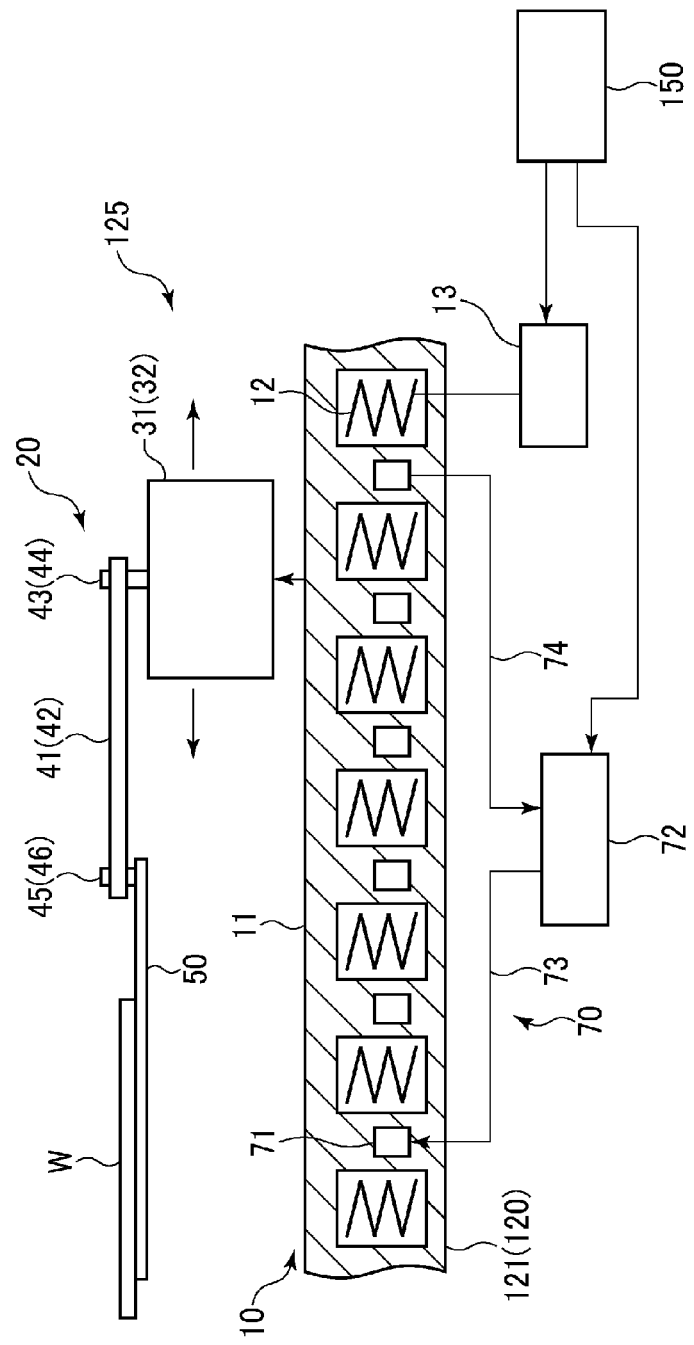
FIG. 2 is a side cross-sectional view illustrating a vacuum transfer device used in the substrate processing system according to the first embodiment.
Figure 3A:
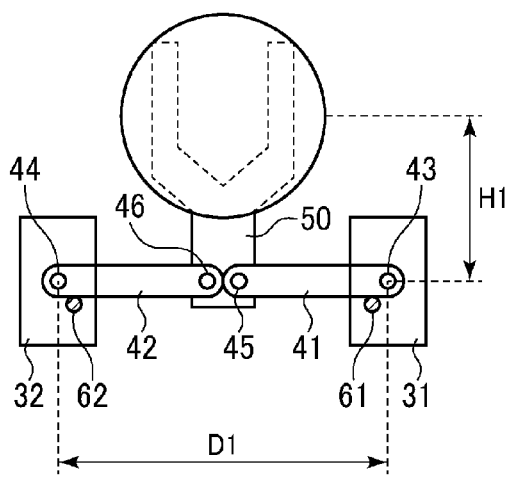
FIGS. 3A and 3B are plan views illustrating an example of a transfer unit in the vacuum transfer device in FIG. 2.
Figure 3B:
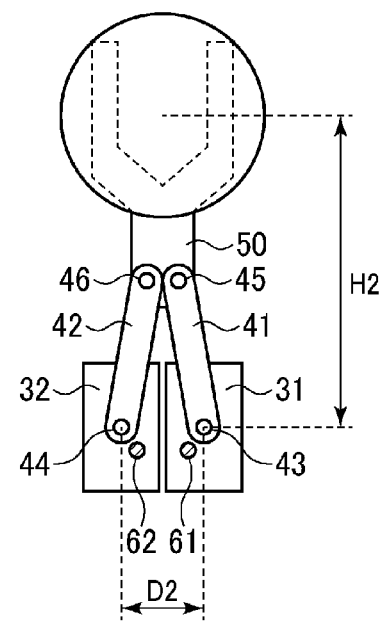
Figure 4:
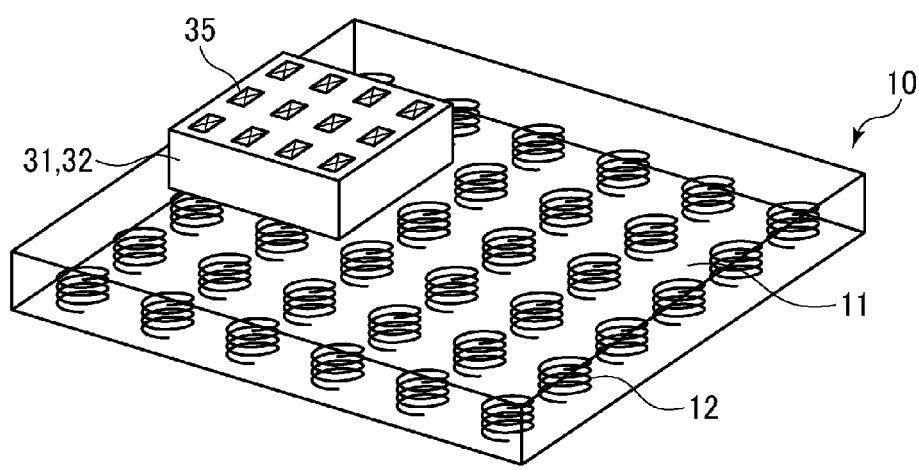
FIG. 4 is a perspective view for explaining a driving principle of a flat motor.
Figure 5:
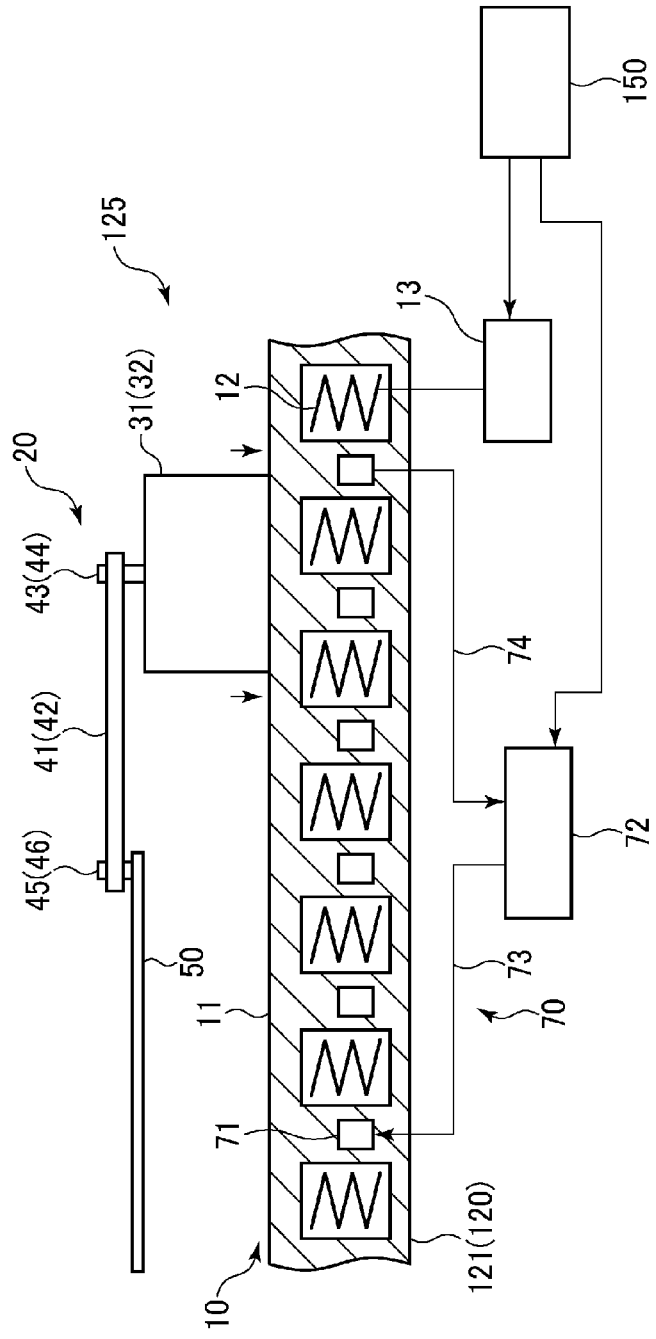
FIG. 5 is a side cross-sectional view for explaining a temperature adjusting operation of the vacuum transfer device in FIG. 2.

Next, the etching processing bath 125 will be described in detail with reference to FIGS. 2 to 5. FIG. 2 is a side cross-sectional view illustrating the vacuum transfer device 125, FIGS. 3A and 3B are plan views illustrating an example of the transfer unit 20, FIG. 4 is a perspective view for explaining a driving principle of a flat motor, and FIG. 5 is a side cross-sectional view for explaining a temperature adjusting operation of the vacuum transfer device 125. FIG. 3A illustrates one example of a posture of the transfer unit 20. FIG. 3B illustrates the other example of a posture of the transfer unit 20.

The substrate transfer device 125 includes a flat motor (linear unit) 10, the transfer unit 20, and a temperature adjusting mechanism 70.

The flat motor (linear unit) 10 includes a body 11 configured as a bottom wall 121 of the vacuum transfer chamber 120, a plurality of electromagnetic coils 12 disposed through the entire inside of the body 11, and a current controller 13 that individually supplies power to the plurality of electromagnetic coils 12 and controls a current of the power. The current controller 13 includes a power supply and a control circuit, and is controlled by the controller 150. A magnetic field is generated by supplying a current to the electromagnetic coil 12.

The transfer unit 20 includes two bases 31 and 32, a link mechanism (links 41 and 42), and the end effector 50 described above. In the drawings, two transfer units 20 are illustrated, but the number of the transfer unit 20 may be one or three or more.

The bases 31 and 32 are configured to include a plurality of permanent magnets 35 (see FIG. 4) arrayed therein, and move the end effector 50 via the link mechanism (links 41 and 42). The bases 31 and 32 magnetically levitate from the surface of the body 11 by setting a direction of the current supplied to the electromagnetic coil 12 in the flat motor (linear unit) 10 such that a magnetic field generated by the current repels the permanent magnet 35. The levitation of the bases 31 and 32 are stopped by stopping the current to the electromagnetic coil 12, and is brought into contact with the floor surface of the vacuum transfer chamber 120, that is, the surface of the body 11 of the flat motor 10. Further, a magnetic field that attracts the permanent magnet 35 is formed by reversing the direction of the current supplied to the electromagnetic coil 12, so that the bases 31 and 32 are pressed against the surface of the body 11 of the flat motor 10. Further, since the current supplied to the electromagnetic coil 12 is individually controlled by the current controller 13, it is possible to control the positions of the bases 31 and 32 by moving the bases 31 and 32 along the surface of the body 11 of the flat motor 10 while magnetically levitating. Further, the levitation amount may be controlled by controlling the current.

The links 41 and 42 that constitute the ling mechanism connect the two bases 31 and 32 with the end effector 50. Specifically, one end side of the link 41 is rotatably connected to the base 31 via a rotation shaft 43 in the vertical direction. The other end side of the link 41 is rotatably connected to the end effector 50 via a rotation shaft 45 in the vertical direction. One end side of the link 42 is rotatably connected to the base 32 via a rotation shaft 44 in the vertical direction. The other end side of the link 42 is rotatably connected to the end effector 50 via a rotation shaft 46 in the vertical direction.

Further, the link mechanism may be configured such that the link angles are moved in conjunction with each other. For example, the link mechanism may include an angle interlocking mechanism (not illustrated) that interlocks the links 41 and 42 such that an angle formed by the extending direction of the end effector 50 (the direction orthogonal to the lines connecting the rotation shafts 45 and 46) and the link 41, and an angle formed by the extending direction of the end effector 50 and the link 42 are equal to each other. The angle interlocking mechanism (not illustrated) is constituted by, for example, a gear or a belt. Therefore, the link mechanism may extend and contract while maintaining the direction of the end effector 50 by changing the distance between the rotation shafts 43 and 44 (i.e., the distance between the bases 31 and 32).

As described above, the end effector 50 is configured to hold the wafer W when transferring the wafer W, and is connected to the link mechanism (links 41 and 42). Then, the two bases 31 and 32 and the end effector 50 are connected with each other via the link mechanism (links 41 and 42), and thus, the end effector 50 may be positioned in a retracted position in FIG. 3A or in an advanced position in FIG. 3B.

That is, in the retracted position in FIG. 3A, the distance between the bases 31 and 32 is set to D1, and an extension distance H1 of the end effector 50 is uniquely determined. Further, in the advanced position in FIG. 3B, the distance between the bases 31 and 32 is set to D2, and an extension distance H2 of the end effector 50 is uniquely determined.

The distance between the bases 31 and 32 is a distance between a reference position of the base 31 and a reference position of the base 32, and in the example, the distance between the rotation shaft 43 and the rotation shaft 44. Further, the extension distance is a distance between a straight line connecting the rotation shaft 43 of the base 31 and the rotation shaft 44 of the base 32, and the center of the wafer W placed on the end effector 50. Further, reference numerals 61 and 62 indicate a stopper that limits the rotation angle of the links 41 and 42, which is provided as needed.

The temperature adjusting mechanism 70 includes a temperature adjusting medium flow path 71 provided in the bottom wall 121 of the vacuum transfer chamber 120, that is, in the body 11 of the flat motor 10, a temperature adjusting medium supply source 72, and temperature adjusting medium circulating paths 73 and 74. For example, water may be used as the temperature adjusting medium.

The temperature adjusting mechanism 70 controls the body 11 of the flat motor 10 to a desired temperature by flowing the temperature adjusting medium supplied from the temperature adjusting medium supply source 72 to the temperature adjusting medium flow path 71 via the temperature adjusting medium circulating paths 73 and 74. Then, as illustrated in FIG. 5, the levitation of the bases 31 and 32 is stopped so that the bases 31 and 32 are brought into contact with the floor surface of the vacuum transfer chamber 120, that is, the surface of the body 11 of the flat motor 10. Thus, the temperature of the transfer unit 20 including the bases 31 and 32 is adjusted by the temperature adjustment by the temperature adjusting medium. Further, a magnetic field that attracts the magnet 35 is formed by reversing the direction of the current supplied to the electromagnetic coil 12, so that the bases 31 and 32 are pressed against the surface (floor surface) of the body 11. Therefore, it is possible to improve the temperature adjusting effect of the transfer unit 20 by the temperature adjusting medium. A cooling region of the temperature adjusting mechanism 70 may be the entire surface of the body 11 (the floor surface of the vacuum transfer chamber 120) of the flat motor 10, but may be a part thereof. Further, the temperature adjustment at this time is, for example, cooling when the wafer W is a heated wafer, and heating when the wafer W is a cooled wafer.

In the vacuum transfer device 125 configured in this manner, a magnetic field that repels the permanent magnetic 35 is generated by controlling a current supplied to the electromagnetic coil 12 by the current controller 13 of the flat motor (linear unit) 10, so that the bases 31 and 32 are in a magnetically levitating state. The levitation amount at this time may be controlled by controlling the current.

By individually controlling the current supplied to the electromagnetic coil 12, the bases 31 and 32 may be moved along the surface (the floor surface of the vacuum transfer chamber 120) of the body 11 of the flat motor 10 in a magnetically levitating state, thereby controlling their positions. Therefore, the transfer unit 20 may be moved and swiveled.

Further, the extending distance of the end effector 50 may be changed by controlling the current supplied to the electromagnetic coil 12 such that the distance between the bases 31 and 32 becomes a desired distance. For example, as illustrated in FIG. 3B, when accessing to the processing chamber 110 or the load lock chamber 130, the distance between the bases 31 and 32 is narrowed so that the extending distance of the end effector 50 is lengthened. Therefore, the end effector 50 may be inserted into the processing chamber 110 or the load lock chamber 120 while the bases 31 and 32 exist on the surface (the floor surface of the vacuum transfer chamber 120) of the body 11 of the flat motor 10. Further, for example, as illustrated in FIG. 3A, when moving and swiveling the transfer unit 20 in the processing chamber 120, the distance between the bases 31 and 32 is widened so that the extending distance of the end effector 50 is shortened. Therefore, since the end effector 50 that holds the wafer W is brought closer to the bases 31 and 32, the sagging and the vibration of the ling mechanism (links 41 and 42) may be reduced, and the displacement of the wafer W during the transfer may be reduced.

In this manner, the gas intrusion from the vacuum seal, which is a problem in the technology using the transfer robot having the articulated arm structure as described in Japanese Patent Laid-Open Publication No. 2017-168866, may be prevented by using the flat motor 10 for the vacuum transfer device 125. Therefore, a high vacuum may be maintained. Further, the dust generation hardly occurs by using the flat motor 10. Further, there is a problem that the throughput is decreased since the movement of the transfer robot is limited. However, by using the flat motor 10 as in the embodiment, the degree of freedom of transfer is high, and thus, the throughput may be maintained high.

In the meantime, when a high-temperature processing (e.g., film formation processing such as CVD, ALD, or PVD) or a low-temperature processing (e.g., film formation processing for a film for MRAM) are continuously performed on the wafer W, heat or cold heat of the wafer W is transmitted to the end effector 50. Then, the heat or the cold heat of the end effector 50 is transmitted to the bases 31 and 32 via the link mechanism (links 41 and 42), and the temperature of the entire transfer unit 20 is changed. Therefore, the transfer accuracy is affected. Further, when the temperature of the wafer W is high, and the temperature of the vases 31 and 32 is the Curie temperature or higher, the magnetic force of the permanent magnet 35 is disappeared, so that the transfer by the magnetic levitation may not be performed. Further, the inside of the vacuum transfer chamber 120 is a vacuum, and it is difficult to adjust the temperature of the magnetically levitating transfer unit 20.

Therefore, in the embodiment, the vacuum transfer device 125 is configured to include the temperature adjusting mechanism 70 that adjusts a temperature of the body 11 of the flat motor 10. Therefore, it is possible to adjust the temperature of the transfer unit 20 by the temperature adjusting medium by stopping the magnetic levitation of the bases 31 and 32 and bringing the bases 31 and 32 into contact with the surface of the body 11. At this time, it is sufficient to stop the supply of the current to the electromagnetic coil 12 so as to stop the magnetic levitation. However, the temperature adjusting effect of the transfer unit 20 may be improved in such a manner that a magnetic field that attracts the magnet 35 is formed by reversing the direction of the current, and the bases 31 and 32 are pressed against the surface (floor surface) of the body 11.

As a specific sequence, when the wafer W is processed by the substrate processing system 100, the vacuum transfer device 125 supplies a current to the electromagnetic coil 12 of the flat motor 10 to form a magnetic field that repels the permanent magnet 35, and the wafer W is transferred while the bases 31 and 32 magnetically levitate. Further, when the wafer W is not transferred, such as when the substrate processing system 100 is idling or after the processing of the wafer W is ended, the bases 31 and 32 are brought into contact with the surface of the body 11 in a state where the magnetic levitation is stopped, and the temperature of the transfer unit 20 is adjusted by the temperature adjusting mechanism 70. When adjusting the temperature, the state where the bases 31 and 32 are in contact with the surface of the body 11 is maintained for a period until the transfer unit 20 is settled at a constant temperature. In this case, a magnetic field that attracts the magnet 35 is formed by setting the direction of the current to be opposite to the direction at the time of the levitation, so that the bases 31 and 32 are pressed against the surface (floor surface) of the body 11. Therefore, the temperature adjusting effect may be improved.

In this manner, it is possible to adjust the temperature of the transfer unit 20 by a simple operation in which the temperature adjusting mechanism 70 is provided in the body 11 of the flat motor 10, and the bases 31 and 32 are brought into contact with the surface of the body 11 by stopping the magnetic levitation of the bases 31 and 32. Therefore, it is possible to suppress the influence of the temperature on the transfer operation such as decrease in the transfer accuracy due to the change of the transfer unit 20 or impossibility of the magnetic levitation during the transfer operation.

Second Embodiment

Next, a second embodiment will be described.

[Substrate Processing System 100']

Figure 6:
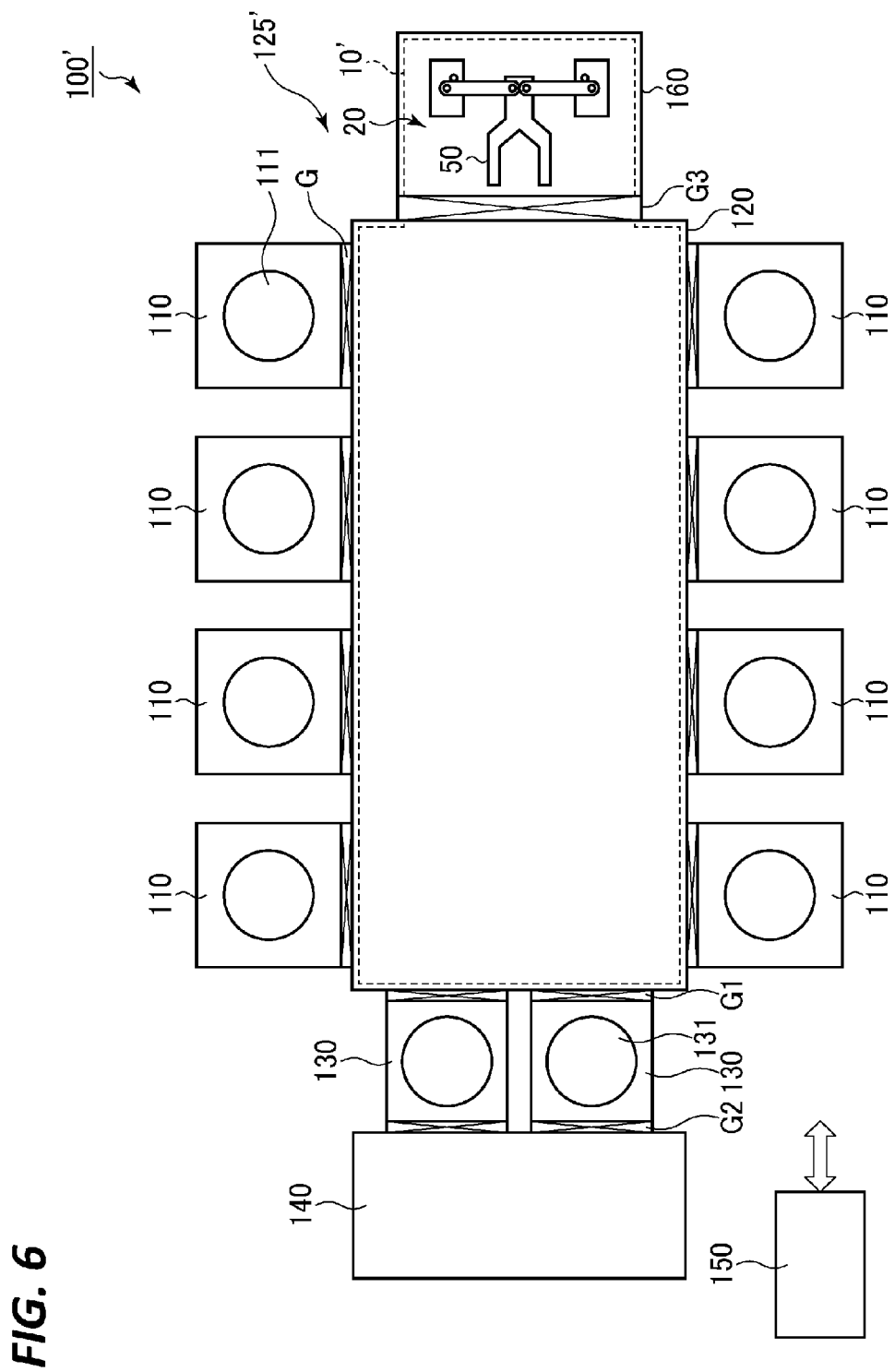
FIG. 6 is a schematic plan view illustrating a substrate processing system according to a second embodiment.

FIG. 6 is a schematic plan view illustrating a substrate processing system 100' according to the second embodiment.

Similar to the substrate processing system 100 in FIG. 1, the substrate processing system 100' of the embodiment continuously performs a desired processing on a plurality of substrates. The basic configuration of the substrate processing system 100' is the same as that of the substrate processing system 100. However, the substrate processing system 100' includes a vacuum transfer device 125' having a configuration different from that of the vacuum transfer device 125 of the first embodiment. Therefore, for the substrate processing system 100', the same components as the substrate processing system 100 are designated by the same reference numerals and description thereof will be omitted. In the following, the vacuum transfer device 125' will be described.

[Vacuum Transfer Device 125']

Figure 7:
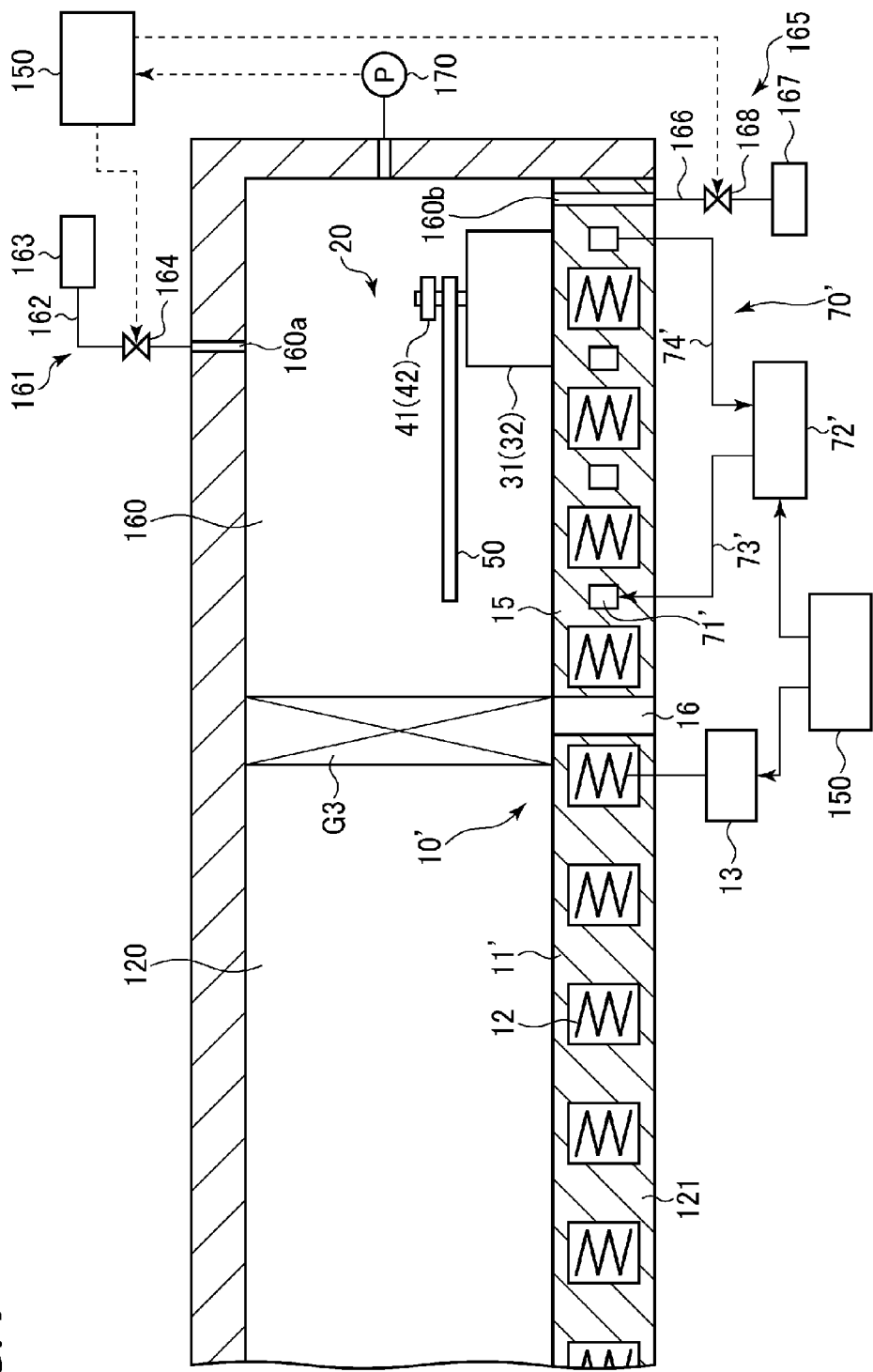
FIG. 7 is a side cross-sectional view illustrating a state where a temperature of a transfer unit in the vacuum transfer device used in the substrate processing system according to the first embodiment is adjusted.

Next, the vacuum transfer device 125' will be described. FIG. 7 is a side cross-sectional view illustrating a state where the temperature of the transfer unit in the vacuum transfer device 125' is adjusted.

The substrate transfer device 125' includes a flat motor (linear unit) 10', the transfer unit 20, and a temperature adjusting mechanism 70'.

The flat motor (linear unit) 10' includes the bottom wall 121 of the vacuum transfer chamber 120, a body 11' configured as an expansion portion 15 expanding from the bottom wall 121, a plurality of electromagnetic coils 12 disposed through the entire inside of the body 11', and the current controller 13 that individually supplies power to the plurality of electromagnetic coils 12 and controls a current of the power. The current controller 13 includes a power supply and a control circuit, and is controlled by the controller 150. Similar to the vacuum transfer device 125 of the first embodiment, a magnetic field is generated by supplying a current to the electromagnetic coil 12. An insulating material 16 is provided between the bottom wall 121 and the expansion portion 15.

The transfer unit 20 has the same configuration as that of the first embodiment, and includes two bases 31 and 32, the link mechanism (links 41 and 42), and the end effector 50.

The temperature adjusting mechanism 70' includes a temperature adjusting medium flow path 71' provided in the expansion region 15 in the body 11' of the flat motor 10', a temperature adjusting medium supply source 72', temperature adjusting medium circulating paths 73' and 74', and a temperature adjusting chamber 160. For example, water may be used as the temperature adjusting medium.

The temperature adjusting mechanism 70' controls the expansion portion 15 of the body 11' of the flat motor 10' to a desired temperature by flowing the temperature adjusting medium from the temperature adjusting medium supply source 72' to the temperature adjusting medium flow path 71' via the temperature adjusting medium circulating paths 73' and 74'.

Further, the temperature adjusting chamber 160 is defined as a space corresponding to the expansion portion 15, is a chamber having an expansion portion 15 as a bottom wall and capable of accommodating the transfer unit 20, and is formed on the short side of the vacuum transfer chamber 120 opposite to the atmospheric transfer chamber 140. A gate valve G3, which is an opening/closing member, is provided between the vacuum transfer chamber 120 and the temperature adjusting chamber 160, and the vacuum transfer chamber 120 and the temperature adjusting chamber 160 are blocked from each other by closing the gate valve G3. The temperature adjusting chamber 160 is provided with a temperature adjusting gas introduction unit 161 and an exhaust unit 165, and the temperature adjustment of the transfer unit 20 is assisted by introducing a temperature adjusting gas into the temperature adjusting chamber 160. The temperature adjusting gas introducing unit 161 includes a gas introducing pipe 162 connected to a gas introducing hole 160a provided in the ceiling wall of the temperature adjusting chamber 160, a temperature adjusting gas supply source 163, and a valve 164 provided in the gas introducing pipe 162. The exhaust unit 165 includes an exhaust pipe 166 connected to a gas discharge hole 160b provided in the expansion portion 15 that constitutes the bottom wall, an exhaust pump 167, and a valve 168 provided in the exhaust pipe 166. The temperature adjusting chamber 160 is connected with a pressure gauge 170 that measures the inner pressure thereof. The measured value of the pressure gauge 170 is sent to the controller 150, and the controller 150 controls the opening/closing of the valve 164 and the valve 168 based on the measured value of the pressure gauge 170.

As illustrated in FIG. 7, when the temperature adjusting mechanism 70' adjusts the temperature of the transfer unit 20, the transfer unit 20 is transferred to the temperature adjusting chamber 160, and the gate valve G3 is closed. Thereafter, the levitation of the bases 31 and 32 is stopped, and the bases 31 and 32 are brought into contact with the surface of the expansion portion 15 of the body 11' of the flat motor 10'. Then, the temperature adjustment by the temperature adjusting medium is started for the transfer unit 20. Next, the valve 164 is opened to introduce a temperature adjusting gas into the temperature adjusting chamber 160. When the measured value of the pressure gauge 170 reaches a predetermined pressure, the valve 164 is closed, and held for a certain period of time. Then, the temperature adjustment by the temperature adjusting gas is performed. After a lapse of a certain period of time, the exhaust valve 168 is opened to exhaust the temperature adjusting gas in the temperature adjusting chamber 160. When the measured value of the pressure gauge 170 is substantially the same as the pressure (vacuum degree) of the vacuum transfer chamber 120, the gate valve G3 is opened, and the transfer unit 20 levitates and is transferred to the vacuum transfer chamber 120. Therefore, since the temperature adjustment by the temperature adjusting medium and the temperature adjustment by the temperature adjusting gas may be performed, it is possible to improve the temperature adjusting effect. Further, similar to the first embodiment, a magnetic field that attracts the magnet 35 by reversing the direction of the current supplied to the electromagnetic coil 12, so that the bases 31 and 32 are pressed against the surface (floor surface) of the body 11'. Therefore, it is possible to improve the temperature adjusting effect of the transfer unit 20 by the temperature adjusting medium. For example, the temperature adjustment at this time is cooling when the wafer W is a heated wafer, and is heating when the wafer W is a cooled wafer.

In the vacuum transfer device 125', the operation when the wafer W is transferred is the same as that of the vacuum transfer device 125 of the first embodiment. That is, a magnetic field that repels the permanent magnetic 35 is generated by controlling a current supplied to the electromagnetic coil 12 the current controller 13 of the flat motor (linear unit) 10', so that the bases 31 and 32 magnetically levitate. Then, by individually controlling the current supplied to the electromagnetic coil 12, the bases 31 and 32 may be moved along the surface (the floor surface of the vacuum transfer chamber 120) of the body 11' of the flat motor 10' in a magnetically levitating state, thereby controlling their positions. Therefore, the transfer unit 20 may be moved and swiveled. Further, as illustrated in FIGS. 3A and 3B, the end effector 50 may be inserted into the processing chamber 110 or the load lock chamber 130 while the bases 31 and 32 exist on the surface of the body 11' of the flat motor 10'. Further, as illustrated in FIG. 3A, when the transfer unit 20 is moved and swiveled, the distance between the bases 31 and 32 are widened to shorten the extending distance of the end effector 50, and thus, the displacement of the wafer W during the transfer may be reduced.

Similar to the vacuum transfer device 125 of the first embodiment, in the vacuum transfer device 125', a high vacuum may be maintained by using the flat motor 10', and also the degree of freedom of the transfer is high, so that a high throughput may be maintained.

Further, in the vacuum transfer device 125', in addition to the temperature adjustment of the transfer unit 20 by the temperature adjusting medium, the temperature adjusting mechanism 70' performs the temperature adjustment by the temperature adjusting gas in the temperature adjusting chamber 160. Therefore, the temperature adjusting effect may be improved. As a result, it is possible to shorten the time to settle the transfer unit 20 at a constant temperature, so that the throughput may be increased.

Further, since the temperature of the transfer unit 20 may be adjusted in this manner, it is possible to suppress the influence of the temperature on the transfer operation such as decrease in the transfer accuracy due to the change of the transfer unit 20 or impossibility of the magnetic levitation during the transfer operation.

In the above embodiments, the transfer unit of the vacuum transfer device including the end effector 50, the bases 31 and 32, and the link mechanism including the links 41 and 42 that connect them is used, but the link mechanism is not necessary. When the link mechanism is not provided, the number of the base may be one. Further, an articulated link mechanism may be used, and also, a link mechanism that displaces in the horizontal direction and a link mechanism that changes in the height direction may be combined.

Further, although the case where the semiconductor wafer (wafer) is sued as the substrate has been described, the present disclosure is not limited to the semiconductor wafer, and other substrates such as a flat panel display (FPD) and a ceramic substrate may be used.

According to the present disclosure, the vacuum transfer device, the substrate processing system, and the substrate processing method capable of suppressing the influence of the temperature on the transfer operation without occurring any problems in the case where the transfer robot is used are provided.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A vacuum transfer device comprising:
    a flat motor including a body, a plurality of electromagnetic coils arrayed in the body, and a current controller configured to control a current supplied to each of the plurality of electromagnetic coils;
    a transfer unit including a substrate holder configured to hold a substrate, a base having a plurality of magnets arrayed therein, and a link connected between the substrate holder and the base and of which an end is rotatably connected to the substrate holder via a rotation shaft in a vertical direction, the transfer unit being configured to magnetically levitate from a surface of the body by a magnetic field generated by supplying power to the plurality of electromagnetic coils, and move in a magnetically levitating state thereby moving the substrate holder; and
    a temperature controller configured to adjust a temperature of at least a portion of the body,
    wherein a temperature of the transfer unit is adjusted by controlling the current supplied to each of the plurality of electromagnetic coils by the current controller to stop the magnetic levitation of the base, and bringing the base into contact with the portion of the body in which the temperature is adjusted.

2. The vacuum transfer device according to claim 1, wherein the transfer unit includes two bases including the base, and two links including the link are configured to connect the two bases with the substrate holder, respectively.

3. The vacuum transfer device according to claim 2, wherein the two links adjust an extending amount of the substrate holder by adjusting a distance between the two bases.

4. The vacuum transfer device according to claim 1, wherein the base magnetically levitates from the surface of the body by setting a direction of the current supplied to each of the plurality of electromagnetic coils such that a magnetic field generated by the current repels the plurality of magnets.

5. The vacuum transfer device according to claim 4, wherein, when the temperature controller adjusts the temperature of the transfer unit, a magnetic field that attracts the plurality of magnets is formed by setting the direction of the current supplied to each of the plurality of electromagnetic coils to be opposite to the direction when the base magnetically levitates, so that the base is pressed against the body.

6. The vacuum transfer device according to claim 1, wherein the temperature controller includes a flow path provided in the body and configured to allow a temperature adjusting medium to flow therethrough.

7. The vacuum transfer device according to claim 1, wherein the vacuum transfer device is movable inside a vacuum transfer chamber maintained in a vacuum, and the body of the flat motor constitutes a bottom wall of the vacuum transfer chamber.

8. The vacuum transfer device according to claim 1, wherein the vacuum transfer device is movable inside a vacuum transfer chamber maintained in a vacuum, and the body of the flat motor is configured to be present in an expansion portion expanding from the vacuum transfer chamber, and
    the temperature controller includes a temperature adjusting portion provided in the expansion portion, and a temperature adjusting chamber configured to define a space corresponding to the expanding portion, introduce a temperature adjusting gas thereinto, be opened/closed by an opening/closing member, and accommodate the transfer unit.

9. The vacuum transfer device according to claim 8, wherein the temperature adjusting portion includes a flow path provided in the expansion portion and configured to allow a temperature adjusting medium to flow therethrough.

10. The vacuum transfer device according to claim 1, wherein the current supplied to each of the plurality of electromagnetic coils is independently controlled such that the base is moved along the surface of the body.

11. A substrate processing system comprising:
    a processing chamber configured to perform a process on a substrate in a vacuum;
    a vacuum transfer chamber connected with the processing chamber and configured to maintain a vacuum state; and
    a vacuum transfer device that is provided movably inside the vacuum transfer chamber and carries in/out the substrate to/from the processing chamber,
    wherein the vacuum transfer device includes:
        a flat motor including a body, a plurality of electromagnetic coils arrayed in the body, and a current controller configured to control a current supplied to each of the plurality of electromagnetic coils;
        a transfer unit including a substrate holder configured to hold a substrate, a base having a plurality of magnets arrayed therein, and a link connected between the substrate holder and the base and of which an end is rotatably connected to the substrate holder via a rotation shaft in a vertical direction, the transfer unit being configured to magnetically levitate from a surface of the body by a magnetic field generated by supplying power to the plurality of electromagnetic coils, and move in a magnetically levitating state thereby moving the substrate holder; and
        a temperature controller configured to adjust a temperature of at least a portion of the body, and
        wherein a temperature of the transfer unit is adjusted by controlling the current supplied to each of the plurality of electromagnetic coils by the current controller to stop the magnetic levitation of the base, and bringing the base into contact with the portion of the body in which the temperature is adjusted.

12. The substrate processing system according to claim 11, wherein the base magnetically levitates from the surface of the body by setting a direction of the current supplied to each of the plurality of electromagnetic coils such that a magnetic field generated by the current repels the plurality of magnets.

13. The substrate processing system according to claim 12, wherein, when the temperature controller adjusts the temperature of the transfer unit, a magnetic field that attracts the plurality of magnets is formed by setting the direction of the current supplied to each of the plurality of electromagnetic coils to be opposite to the direction when the base magnetically levitates, so that the base is pressed against the body.

14. The substrate processing system according to claim 11, wherein the temperature controller includes a flow path provided in the body and configured to allow a temperature adjusting medium to flow therethrough.

15. The substrate processing system according to claim 11, wherein the body of the flat motor constitutes a bottom wall of the vacuum transfer chamber.

16. The substrate processing system according to claim 11, wherein the body of the flat motor is configured to be present in an expansion portion expanding from the vacuum transfer chamber, and
the temperature controller includes a temperature adjusting portion configured to adjust temperature of the expansion portion, and a temperature adjusting chamber configured to define a space corresponding to the expanding portion, introduce a temperature adjusting gas thereinto, be opened/closed by an opening/closing member, and accommodate the transfer unit.

17. The substrate processing system according to claim 16, wherein the temperature adjusting portion includes a flow path provided in the expansion portion and configured to allow a temperature adjusting medium to flow therethrough.

18. The substrate processing system according to claim 11, wherein the current supplied to each of the plurality of electromagnetic coils is independently controlled such that the base is moved along the surface of the body.

19. A substrate processing method comprising:
providing a substrate processing system including:
a processing chamber configured to perform a process on a substrate in a vacuum;
a vacuum transfer chamber connected with the processing chamber and configured to maintain a vacuum state; and
a vacuum transfer device that is provided movably inside the vacuum transfer chamber and carries in/out the substrate to/from the processing chamber, wherein the vacuum transfer device includes:
a flat motor including a body, a plurality of electromagnetic coils arrayed in the body, and a current controller configured to control a current supplied to each of the plurality of electromagnetic coils;
a transfer unit including a substrate holder configured to hold a substrate, a base having a plurality of magnets arrayed therein, and a link connected between the substrate holder and the base and of which an end is rotatably connected to the substrate holder via a rotation shaft in a vertical direction, the transfer unit being configured to magnetically levitate from a surface of the body by a magnetic field generated by supplying power to the plurality of electromagnetic coils, and move in a magnetically levitating state thereby moving the substrate holder; and
a temperature controller configured to adjust a temperature of at least a portion of the body,
performing a processing on the substrate by causing the base to magnetically levitate from a surface of the body by a magnetic field generated by supplying power to the plurality of electromagnetic coils, moving the base in a magnetically levitating state along the body, and bringing the substrate held by the substrate holder into the processing chamber; and
adjusting a temperature of the transfer unit by controlling the current supplied to each of the plurality of electromagnetic coils by the current controller to stop the magnetic levitation of the base, and bringing the base into contact with the portion of the body in which the temperature is adjusted.

20. The substrate processing method according to claim 19, wherein the current supplied to each of the plurality of electromagnetic coils is independently controlled such that the base is moved along the surface of the body.

* * * * *